United States Patent

Ma et al.

[11] Patent Number: 6,060,896
[45] Date of Patent: May 9, 2000

[54] SUPER-VOLTAGE CIRCUIT WITH A FAST RESET

[75] Inventors: Manny K. F. Ma; Joseph C. Sher, both of Boise, Id.

[73] Assignee: Micron Technology, Inc., Boise, Id.

[21] Appl. No.: 08/977,339

[22] Filed: Nov. 24, 1997

Related U.S. Application Data

[63] Continuation of application No. 08/574,405, Dec. 18, 1995, Pat. No. 5,712,575.

[51] Int. Cl.$^7$ .................................................. G01R 31/28
[52] U.S. Cl. ............................ 324/763; 365/201; 714/718
[58] Field of Search ..................................... 324/763, 765, 324/766, 158.1; 365/201; 714/718, 721

[56] References Cited

U.S. PATENT DOCUMENTS

| | | | |
|---|---|---|---|
| 4,398,146 | 8/1983 | Draheim et al. | 324/765 |
| 4,550,289 | 10/1985 | Kabashima et al. | 324/763 |
| 4,612,499 | 9/1986 | Andersen et al. | 714/721 |
| 4,970,454 | 11/1990 | Stambaugh et al. | 324/765 |
| 5,796,266 | 8/1998 | Wright et al. | 324/763 |

*Primary Examiner*—Ernest Karlsen
*Attorney, Agent, or Firm*—Dorsey & Whitney LLP

[57] ABSTRACT

A super-voltage circuit with a fast reset capability is formed in an integrated circuit for generating a test mode logic state for testing other circuits in the same integrated circuit. The super-voltage circuit includes a sensing circuit, a reset circuit, and an output circuit connected to both the sensing circuit and the reset circuit. When the input voltage receives a super-voltage which is higher than either the logic high or low voltages, the sensing circuit generates at its output a high voltage. The reset circuit also receiving the same input voltage as the sensing circuit generates at its output a logic low state when the input voltage is at the super-voltage or logic high voltage. When the sensing circuit is generating the high voltage and the reset circuit is generating the logic low state the output circuit generates at its output a logic low voltage. The logic low voltage signifies that the integrated circuit is now in the super-voltage test mode. To terminate the test mode, the super-voltage is removed from the input of the sensing circuit. As the input voltage falls to 0 volts, the reset circuit generates a logic high voltage. In response to the logic high voltage, the output circuit quickly resets its output to a logic high state signifying that the integrated circuit is now in a normal operational mode.

16 Claims, 3 Drawing Sheets

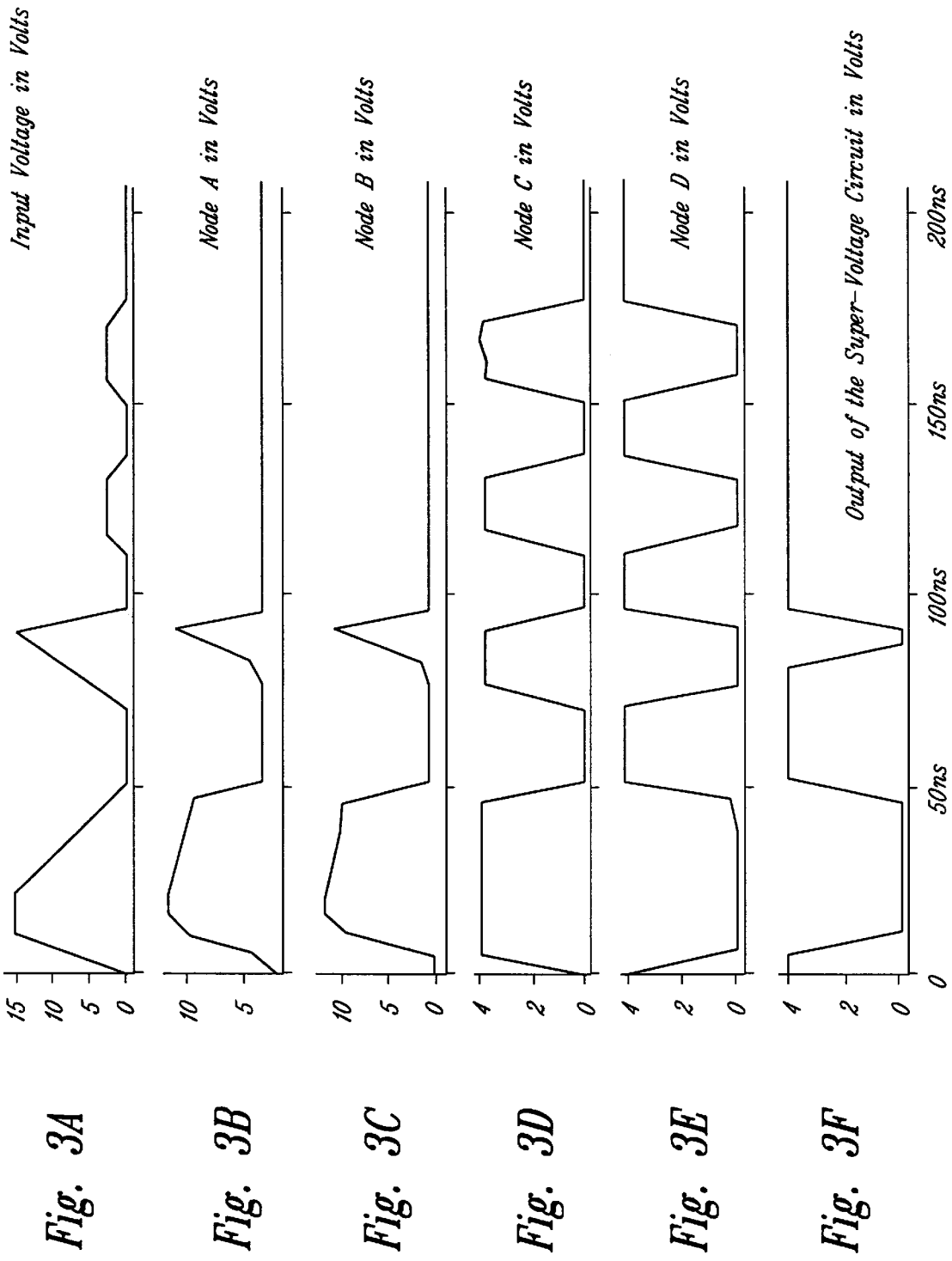

SUPER-VOLTAGE CIRCUIT WITH A FAST RESET

CROSS-REFERENCE TO RELATED APPLICATION

This application is a continuation of U.S. patent application Ser. No. 08/574,405, filed Dec. 18, 1995, now U.S. Pat. No. 5,712,575.

TECHNICAL FIELD

This invention relates to integrated circuits, and more particularly, to a super-voltage circuit for generating a test mode logic signal for testing memory integrated circuit devices.

BACKGROUND OF THE INVENTION

When integrated circuits are manufactured, they are tested for various operating characteristics such as response time and tolerance to noise. In one method of testing an integrated circuit, and in particular, a memory chip, an external testing device writes a predetermined bit pattern in a selected location of the memory. Once written, the testing device reads back the bit pattern for verification. This is a rather slow process, however, since the testing device can only test a few bits at a time. For example, in a 1M×4 (1 megabit by 4 bits) memory chip, the testing device can test only 4 bits at a time in a normal operational mode. To speed up this testing process, a super-voltage circuit is used to place the memory chip into a super-voltage test mode for more efficient testing of the memory. For example, in the same 1M×4 memory chip, the super-voltage test mode may allow testing of 16 bits at a time. In practice, both the super-voltage test mode and normal operational mode are used to more completely test the memory chip.

The super-voltage circuit is formed on the same memory chip and comprises a sensing circuit, and an output circuit. Typically, the input of the super-voltage circuit is coupled to one of the external pins of the memory chip such as an address line or any other suitable external pin. To place the memory chip into the super-voltage test mode, the testing device applies a "super-voltage" on the selected external pin. The super-voltage is typically higher than the voltage of either a logic high signal or a logic low signal. For a 5 volt IC device, for example, the super-voltage may be 8 volts or more while the logic high voltage may be in the range of 2.4 volts to 6 volts, and the logic low voltage may be in the range of −1 volts to 0.8 volts.

When the testing device applies the super-voltage to the selected pin of the memory chip, the sensing circuit senses the super-voltage on the pin and switches its output high. In response, the output circuit switches its output to logic low signifying that the memory chip is now in the super-voltage test mode. To terminate the super-voltage test mode, the testing device removes the super-voltage from the memory chip. The sensing circuit senses the drop in the input and pulls its output low through its pull-down circuit. The pull-down circuit generally includes a pair of long L transistors designed to minimize the current drain of the super-voltage circuit. Due to these long-channel transistors, the sensing circuit takes a relatively long time to switch its output low. In one embodiment, for example, it may take approximately 150 nanoseconds to switch the output of the sensing circuit to logic low. In response to the logic low output after the 150 nanoseconds delay, the output circuit resets its output to logic high signifying that the memory chip is no longer in the super-voltage test mode.

The switching delay of the sensing circuit means that the memory chip is erroneously in the super-voltage test mode for 150 nanoseconds after the super-voltage is removed. Consequently, the testing device needs to be programmed to wait during the switching delay period before the memory chip can subsequently be tested in the normal mode.

Thus, it is desirable to provide a super-voltage circuit with a fast reset capability to improve the speed of testing memory chips.

SUMMARY OF THE INVENTION

According to the principles of the present invention, a super-voltage circuit with a fast reset capability is formed in an integrated circuit for generating a test mode logic state for testing other circuits in the same integrated circuit. The super-voltage circuit includes a sensing circuit, a reset circuit, and an output circuit connected to both the sensing circuit and the reset circuit. The sensing circuit has an input for receiving an input voltage. The input voltage may be a logic low voltage, logic high voltage, or super-voltage. The super-voltage relative to a reference potential or ground is higher than the logic high voltage. In turn, the logic high voltage relative to the reference potential is higher than the logic low voltage. When the input voltage is at the super-voltage, the sensing circuit senses the super-voltage and generates at its output a high voltage. On the other hand, when the input voltage is at the logic high or low voltage, the sensing circuit generates a low voltage. The reset circuit has an input receiving the same input voltage as the sensing circuit. In a preferred embodiment, the reset circuit generates at its output a logic low state when the input voltage is at the logic high voltage or super-voltage. On the other hand, when the input is at the logic low voltage, the reset circuit generates a logic high state. The output circuit has a first input connected to the output of the sensing circuit, and a second input connected to the output of the reset circuit. When the first input is at the high voltage and the second input is at the logic low state, the output circuit generates at its output a logic low voltage. The logic low voltage signifies that the integrated circuit is now in the super-voltage test mode. To terminate the test mode, the super-voltage is removed from the input of the sensing circuit. As the input voltage falls to 0 volts, the reset circuit generates a logic high voltage. In response to the logic high voltage, the output circuit quickly switches its output to a logic high state signifying that the integrated circuit is now in the normal operational mode.

BRIEF DESCRIPTION OF THE DRAWINGS

FIGS. 3A–3F are graphs of the voltage levels of various nodes on the circuit of FIG. 2 as a function of time.

DETAILED DESCRIPTION OF THE INVENTION

Figure 1:
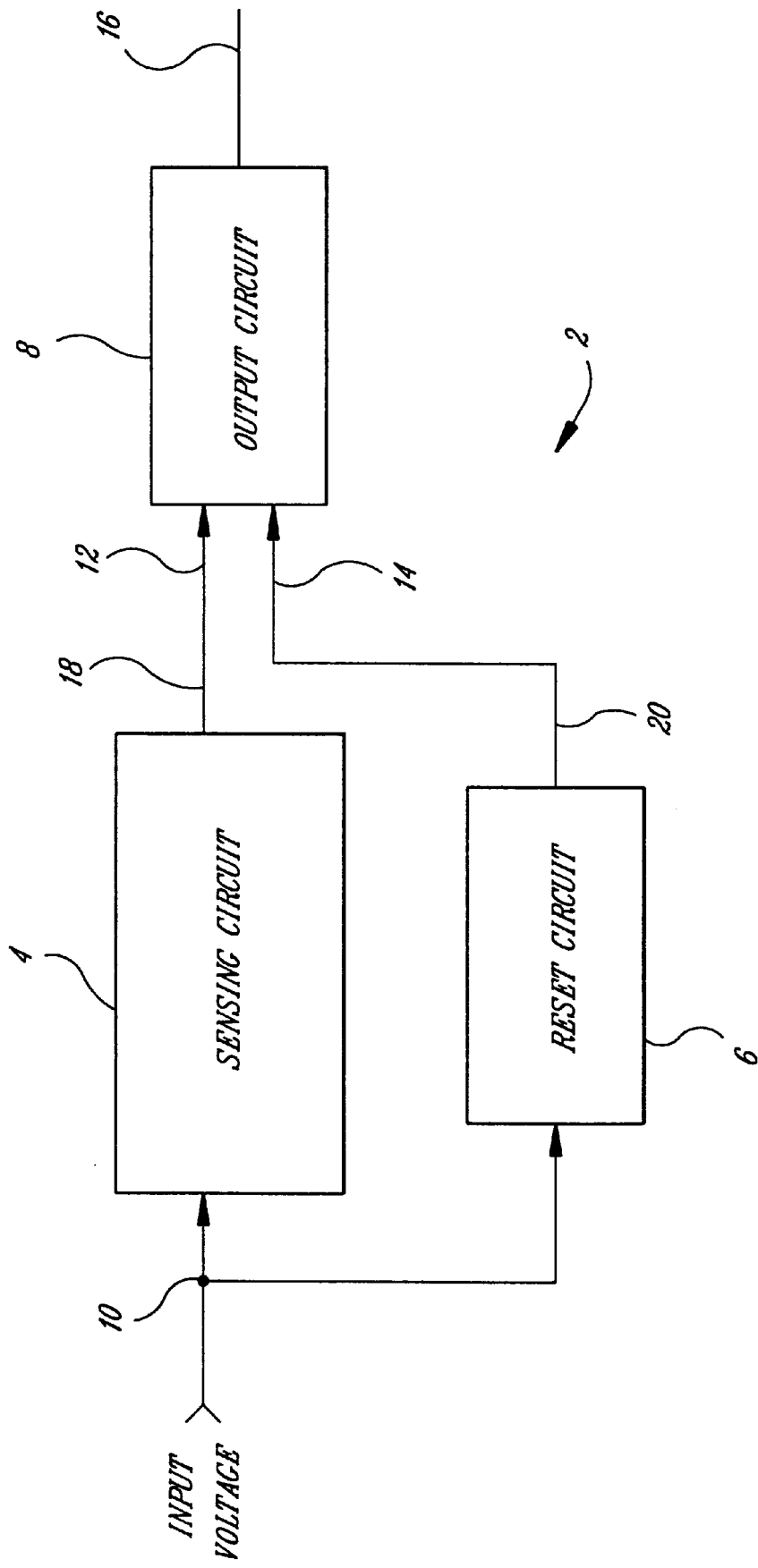
FIG. 1 is a block diagram of a super-voltage circuit according to the present invention.

FIG. 1 is a block diagram of a super-voltage circuit according to the present invention. The super-voltage circuit comprises a sensing circuit 4, a reset circuit or switching circuit 6, and output circuit 8. The sensing circuit 4 has an input 10 for receiving an input voltage. The input 10 is generally coupled to one of the external pins of an integrated circuit chip such as a memory chip in which the super-voltage circuit is formed. The reset circuit also has an input 10 and receives the same input voltage as the sensing circuit 4. The output circuit 8 has a first input 12 connected to the output 18 of the sensing circuit 4 and a second input 14 connected to the output 20 of the reset circuit 6. The output circuit 8 generates at its output 16 a logic high state when the memory chip is in a normal operational mode and a logic low state when the memory chip is in a super-voltage test mode.

In operation, when the super-voltage circuit 2 receives a super-voltage at input 10, the sensing circuit 4 senses the super-voltage and switches its output 18 from a low voltage to a high voltage. On the other hand, the reset circuit receiving the same super-voltage switches its output 20 from a logic high state to a logic low state. In response to the high voltage at the first input 12 and the logic low state at the second input 14, the output circuit switches its output 16 from the logic high state to the logic low state. The logic low state at the output 16 signifies that the memory chip is in the super-voltage test mode. When the super-voltage is removed from the input 10, the reset circuit switches its output 20 relatively fast from the logic low state to the logic high state. In response to the logic high state at the second input 14, the output circuit resets its output 16 from the logic low state to the logic high state signifying that the memory chip is now in the normal operational mode.

Figure 2:
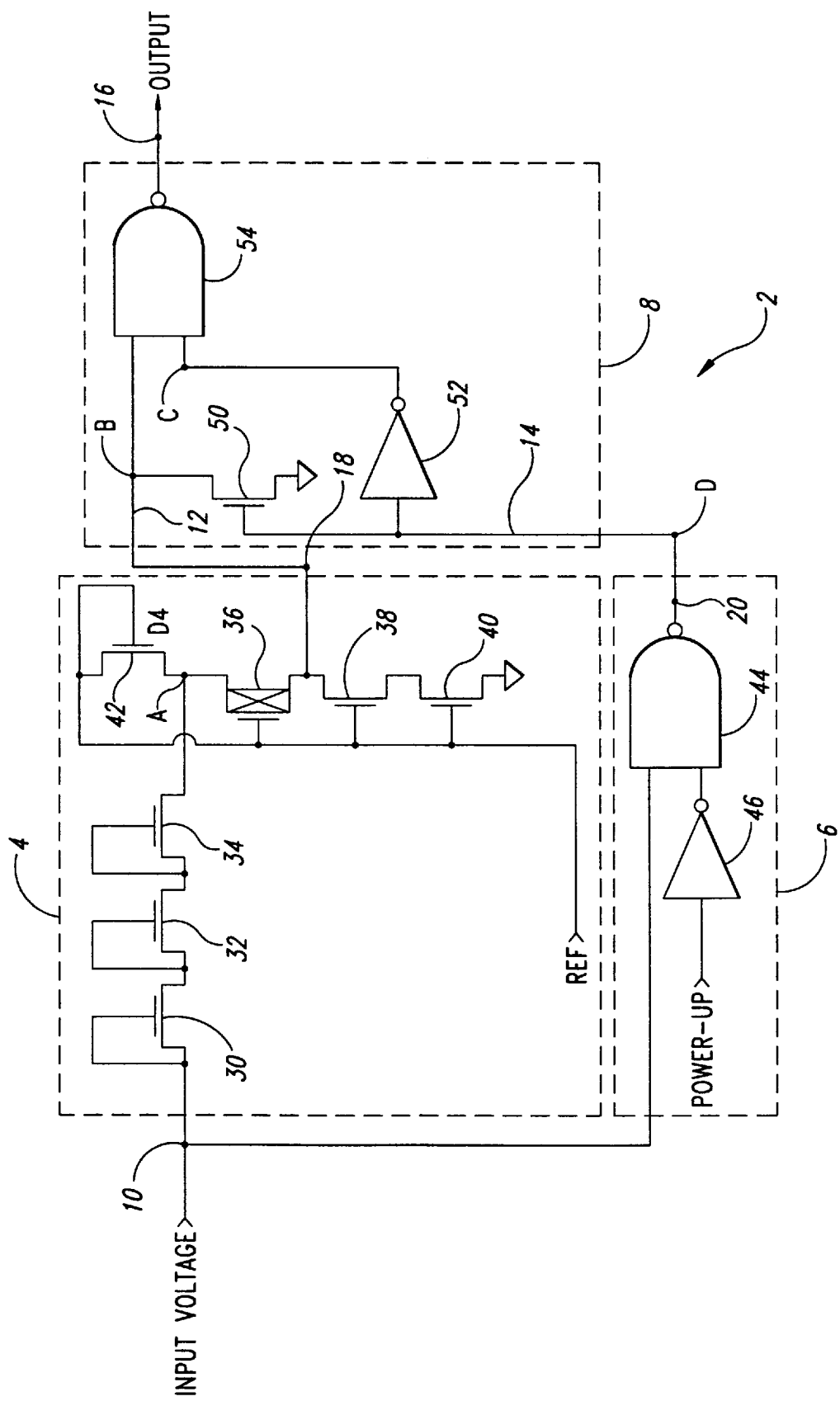
FIG. 2 is a detailed schematic circuit diagram of a preferred embodiment of the circuit of FIG. 1.

FIG. 2 shows a detailed schematic circuit diagram of a preferred embodiment of the circuit of FIG. 1. The sensing circuit 4 has an input 10 for receiving an input voltage. Three n-channel transistors 30–34 are configured as diodes and connected in series between the input 10 and node A. A p-channel transistor 36 and n-channel transistors 38–40 are connected in series with each other between node A and ground or reference potential. The gates of transistors 36–40 are all connected to a reference voltage REF. In a preferred embodiment the reference voltage REF is maintained at a constant voltage level of approximately 3.5 volts and is designed to provide a current leakage path for node A through the transistors 36–40. Preferably, the transistors 38–40 are long L devices designed to lower power dissipation of the super-voltage circuit 2. An n-channel transistor 42 configured as a diode also receives the reference voltage REF. The transistor 42 is designed to maintain node A at one threshold voltage drop below the reference voltage REF when no super-voltage is being applied to the input 10. Assuming the voltage of REF is at 3.5 volts, node A is maintained at approximately 2.8 volts assuming that the threshold voltage of the transistor 42 is 0.7 volts.

The reset circuit 6 includes an inverter 46, and a NAND gate 44. The input of the inverter 46 receives a power-up signal and its output is connected to one input of the NAND gate 44. The other input of the NAND gate 44 is connected to the input 10.

The output circuit 8 includes an n-channel transistor 50, an inverter 52, and a NAND gate 54. The output circuit also has a first input 12 connected to the output 18 of the sensing circuit 4, and a second input 14 connected to the output 20 of the reset circuit 6. The transistor 50 connected between node B and the reference potential or ground has its gate connected to the second input 14. The input of the inverter 52 is also connected to the second input 14. The first input 12 and the output of the inverter 52 provides the two inputs to the NAND gate 54. The output 16 of the NAND gate 54 defines the output 16 of the super-voltage circuit 2. The output 16 is connected to other circuits of the memory chip to place the memory chip into either the normal operational mode or the super-voltage test mode. The operation of the super-voltage circuit 2 will now be described with reference to FIG. 2.

Generally, the input 10 is coupled to an external pin of an integrated circuit device such as a memory chip. When the memory chip is in the normal operational mode, the input 10 is switching between either a logic low state or a logic high state. When the input 10 is switching between the two logic states, the voltage at node A does not change. Assume, for example, the sensing circuit 4 is receiving the logic high state of 5 volts. Assume further that the threshold voltage drop of each transistor is 1 volt and the reference voltage REF is 3.5 volts. Since node A is at one threshold voltage drop from the reference voltage REF, node A is initially at 2.8 volts. When 5 volts is applied at the input 10, node A stays at 2.8 volts since it requires at least 7.5 volts to forward bias all three transistors 30–34 and turn on the transistor 36. The p-channel transistor 36 is in an off-state since the gate voltage of 3.5 volts is higher than the voltage at node A. On the other hand the transistors 38–40 are on due to the gate voltage of 3.5 volts. Thus, the sensing circuit generates at its output 18 a low voltage of 0 volts. Referring now to the reset circuit 6, the power-up signal being received by the inverter 46 is used to reset the super-voltage circuit 2 upon a power-up of the memory chip. Thereafter, the power-up signal is maintained at the logic low state as long as the memory chip is powered up. In response, the inverter 46 generates a logic high state at its output. In this state, the NAND gate 44 acts as an inverter. Thus, when the input 10 is at logic high, the reset circuit generates a logic low at its output 20, and when the input is at logic low, the output 20 is at logic high. Since the output 20 is connected to the input of the inverter 52, node C tracks the logic state of input 10. Specifically, when the input 10 is at logic low, node C is at logic low, and when the input is at logic high, node C is at logic high. However, since node B is grounded through the transistors 38–40, the output of the NAND gate 54 is at logic high regardless of the state of node C. As is well-known in the art, the output of a NAND gate cannot go low when one input is at logic low. Thus, when the input 10 is switching between logic low and high states, the super-voltage circuit 2 generates and maintains a logic high state at its output 16. The logic high state at the output 16 signifies that the memory chip is in the normal operating mode.

To place the memory chip into the super-voltage test mode, a testing device (not shown) applies the super-voltage at the external pin to which the input 10 is coupled. As the input voltage rises sufficiently to forward bias the transistors 30–34, the voltage at node A begins to rise. As the voltage level at node A rises, it turns on the transistor 36 and node B begins to track the voltage level of node A. For example, when the input voltage reaches a threshold voltage of approximately 9 volts, node B rises to a high voltage of approximately 3 volts. At the same time, the reset circuit receives the super-voltage from the input 10 and switches its output 20 to logic low. The logic low signal at the output 20 is received by the second input 14. The inverter 52 receiving the logic low signal switches its output to logic high. The NAND gate 54 receives the high voltage from the first input 12 and the logic high signal from node C, and switches the output 16 to logic low signifying that the memory chip is now in the super-voltage test mode.

To terminate the super-voltage test mode and reset the super-voltage circuit, the testing device removes the super-voltage from the memory chip and allows the input 10 to fall to 0 volts. The sensing circuit senses the drop at the input 10 and tries to pull its output 18 to logic low. However, due to the long channels present in the transistors 38–40, the sensing circuit by itself cannot quickly switch its output to logic low. Specifically, the charge stored on node A cannot bleed away fast enough to switch the output 18 to logic low and reset the output 16 of the super-voltage circuit to logic high. According to the principles of the present invention, however, the reset circuit 6 quickly pulls the output of the sensing circuit to logic low immediately after the super-voltage is removed. Specifically, the reset circuit 6 receiving the logic low at the input 10 switches its output 20 to logic high. The logic high signal at the output 20 turns on the n-channel transistor 50 and provides a path to ground for node A such that the charge stored on node A quickly bleeds away through the transistor 50 to produce a logic low state at node A. The logic high signal at the output 20 also causes the inverter 52 to switch to the logic low signal at node C. As is well-known in the art, the output of a NAND gate switches to the logic high state when one input is at logic low. Accordingly, the NAND gate 54 receiving the logic low signal at either node B or node C switches the output 16 to a logic high state to quickly reset the super-voltage circuit. This allows the testing device to test the memory chip in the normal operational mode immediately after the super-voltage is removed from the input 10. This entire reset process according to the present invention takes place in a few nanoseconds compared to approximately 150 nanoseconds previously necessary without the reset circuit 6.

Once the super-voltage circuit is reset to the logic high state, the input 10 can switch between logic low and logic high, and vice versa as is done during the normal operational mode of the memory chip. This does not, however, affect the output 16 of the super-voltage circuit. As discussed above in detail, the output of the sensing circuit only responds to the super-voltage and maintains the low voltage output, for example 2.8 volts, when no super-voltage is present. Thus, the sensing circuit locks the output of the super-voltage circuit at logic high.

FIGS. 3A–3F show two examples of the voltage levels of various nodes on the circuit of FIG. 2 as a function of time in nanoseconds. In the first example, during the initial 10 nanoseconds, the input 10 rises from 0 volts to a super-voltage of 15 volts. As the input rises above a threshold voltage of the reset circuit of approximately 2 volts, the reset circuit 6 switches node D from logic high to logic low. The logic low at node D, in turn, causes node C to switch to logic high. The rise in input from 0 volts to the super-voltage also causes node A to rise. As the input rises above a threshold voltage of the sensing circuit of approximately 8 volts at close to 6 nanoseconds, the rise in the voltage level at node A turns on the p-channel transistor 36 and node B begins to rise to a logic high voltage of 2.5 volts. In response to the logic high voltage at node B and the logic high state at node C, the output 16 of the super-voltage circuit switches to logic low signifying that the memory chip is now in the super-voltage test mode. From 20 nanoseconds to 50 nanoseconds, the input voltage falls gradually from 15 volts to 0 volts. While the input voltage is falling, the charge stored at node A slowly discharges through the transistor 36 and the long L transistors 38–40. Due to the long L transistors, the voltage levels at nodes A and B fall at a slower rate than the input voltage. At approximately 45 nanoseconds, however, the input voltage falls sufficiently low to switch node D to logic high. The logic high at node D turns on the transistor 50 to provide a ground path for nodes A and B. The remaining charge at node A quickly discharges through the transistor 50 to bring the voltage level at node B to 0 volts. The logic high at node D also switches node C to logic low or 0 volts. In response to the 0 volts at either node B or C, the output 16 of the super-voltage circuit switches to logic high signifying that the memory chip is in the normal operational mode. It remains in this state until the input voltage rises above the threshold voltage.

In the second example, from approximately 70 to 95 nanoseconds, the input quickly rises from 0 volts to 15 volts and falls to 0 volts again. The operation of the super-voltage circuit in the initial part of that time period is similar to that of the initial 50 nanosecond period. From approximately 90 to 95 nanoseconds, the input voltage falls rapidly to 0 volts. In the prior art the sensing circuit takes a relatively long 150 nanoseconds to switch its output to 0 volts. According to the circuit of FIG. 2, however, the reset circuit 6 switches its output to logic high and turns on the transistor 50. The transistor 50 quickly pulls the output of the sensing circuit to 0 volts. As can be seen in FIG. 3C, this occurs within a few nanoseconds. Once the super-voltage is removed, the input 10 is allowed to switch between logic low and logic high. Specifically, from 110 to 180 nanoseconds the input voltage varies between 0 and 3 volts. During this time period, nodes C and D switch between logic low and logic high in response to the input voltage. This does not, however, affect the output 16 of the super-voltage circuit because the input 10 does not affect the low voltage output of the sensing circuit at node B. Thus, the sensing circuit locks the output 16 of the output circuit at logic high during the normal operational mode.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

What is claimed is:

1. A super-voltage circuit having an input terminal receiving an input signal, the super-voltage circuit comprising:

a detection circuit coupled to the input terminal, the detection circuit generating a detect signal in response to the input signal having a magnitude with an absolute value that is greater than a predetermined value;

a reset circuit coupled to the input terminal, the reset circuit generating a reset signal in response to the input signal having a first logic level and generating an enable signal in response to the input signal having a second logic level, the second logic level having a magnitude that is between the magnitude of the first logic level and the predetermined value; and a logic circuit having first and second input terminals coupled to the reset circuit and the detection circuit, respectively, the logic circuit generating a super-voltage signal responsive to receiving the detect signal and the enable signal, the logic circuit terminating the super-voltage signal responsive to either the detect signal being terminated or the reset signal being generated.

2. The super-voltage circuit of claim 1 wherein the detection circuit is structured to generate the detect signal in response to the input signal having a positive polarity that is greater than the predetermined value.

3. The super-voltage circuit of claim 1 wherein the reset circuit is structured to generate the reset signal responsive to receiving an input signal having a low logic level and to generate the enable signal responsive to receiving an input signal having a high logic level.

4. The super-voltage circuit of claim 1 wherein the detection circuit comprises:

a voltage dropping circuit coupled to receive the input signal, the voltage dropping circuit generating a first signal having a magnitude corresponding to the input signal less a predetermined magnitude; and a comparison circuit comparing the first signal to a predetermined value, the comparison circuit generating the detect signal responsive to the first signal exceeding the predetermined value.

5. The super-voltage circuit of claim 1 wherein the logic circuit comprises a NAND gate.

6. The super-voltage circuit of claim 1 wherein the detection circuit has a response time that is slower than a response time of the reset circuit.

7. A method of generating a super-voltage signal in an integrated circuit; comprising:

examining an input signal received at an input terminal of the integrated circuit, comprising;

determining the logic level of the input signal;

if the input signal has the first logic level, generating a reset signal;

if the input signal has a second logic level, with a magnitude that is greater than the magnitude of the first logic level, generating an enable signal;

if the input signal has a magnitude that is greater than the magnitude of the second logic level by a predetermined value, generating a detect signal;

determining if both the enable signal and the detect signal are being generated, and generating the super-voltage signal when the enable signal and the detect signal are both being generated; and determining if either the reset signal is being generated or the detect signal has been terminated, and terminating the super-voltage signal when either the reset signal is generated or the detect signal is terminated.

8. The method of claim 7 wherein the step of determining if the input signal has a first logic level is performed more rapidly than the step of determining if the input signal has a magnitude that is greater than the magnitude of the second logic level by a predetermined value.

9. The method of claim 7 wherein the step of determining the logic level of the input signal comprises determining if the input signal has a magnitude that is greater than the magnitude of the second logic level by a predetermined value, which further comprises:

subtracting a predetermined value from the input signal to obtain a reduced value; and determining if the reduced value is greater than predetermined threshold.

10. The method of claim 7 wherein the step of determining the logic level of the input signal comprises determining if the input signal has a level corresponding to logic "0".

11. The method of claim 7 wherein the step of determining the logic level of the input signal comprises determining if the input signal has a level corresponding to logic "1".

12. The method of claim 7 wherein the step of determining the logic value of the input signal comprises determining if the input signal has a magnitude that is greater than the magnitude of the second logic level by a predetermined value, which further comprises determining if the input signal is a positive voltage that is greater than a predetermined positive voltage.

13. A method of terminating a super-voltage signal in an integrated circuit, comprising:

examining an input signal applied to an input terminal of a super-voltage circuit in the integrated circuit;

determining if the input signal has a magnitude that is greater than a first predetermined value determining if the input signal has a magnitude that is less than a second predetermined value;

if the input signal is determined to have a magnitude that is greater than the first predetermined value, generating the super-voltage signal; and if the input signal is determined to have a magnitude that is less than the second predetermined value, terminating the super-voltage signal by coupling an internal node of the super-voltage circuit to a reference potential to rapidly deplete a stored charge in 14. The method of claim 13 wherein the step of determining if the input signal has a magnitude that is greater than a first predetermined value comprises:

subtracting a value from the input signal to obtain a reduced value; and determining if the reduced value is greater than a predetermined threshold.

15. The method of claim 13 wherein the step of determining if the input signal has a magnitude that is less than a second predetermined value comprises determining if the input signal has a magnitude corresponding to a logic "0".

16. The method of claim 13 wherein the step of determining if the input signal has a magnitude that is greater than a first predetermined value comprises determining if the input signal is a positive voltage that is greater than a predetermined positive voltage.

* * * * *

UNITED STATES PATENT AND TRADEMARK OFFICE
CERTIFICATE OF CORRECTION

PATENT NO. : 6,060,896  
DATED : May 9, 2000  
INVENTOR(S) : Manny K. F. Ma and Joseph C. Sher Page 1 of 1

It is certified that error appears in the above-identified patent and that said Letters Patent is hereby corrected as shown below:

<u>Column 8,</u>  
Line 19, "determined value" should read -- determined value; --  
Line 29, "charge in" should read -- charge in the super-voltage circuit --

Signed and Sealed this

Thirteenth Day of November, 2001

Attest:

*Nicholas P. Godici*

NICHOLAS P. GODICI  
*Attesting Officer*  *Acting Director of the United States Patent and Trademark Office*

UNITED STATES PATENT AND TRADEMARK OFFICE
CERTIFICATE OF CORRECTION

PATENT NO.     : 6,060,896
DATED          : May 9, 2000
INVENTOR(S)    : Manny K. F. Ma and Joseph C. Sher It is certified that error appears in the above-identified patent and that said Letters Patent is hereby corrected as shown below:

<u>Column 8,</u>
Line 19, "predetermined value" should read -- predetermined value; --
Line 29, "charge in" should read -- charge in the super-voltage circuit --

Signed and Sealed this

Seventeenth Day of September, 2002

Attest:

Attesting Officer

JAMES E. ROGAN
*Director of the United States Patent and Trademark Office*